US006100004A

United States Patent [19]

Elsaesser et al.

[11] Patent Number: 6,100,004

[45] Date of Patent: Aug. 8, 2000

[54] RADIATION-SENSITIVE MIXTURE AND RECORDING MATERIAL MADE THEREOF FOR OFFSET PRINTING PLATES

[75] Inventors: Andreas Elsaesser, Idstein; Otfried Gaschler, Wiesbaden; Helmut Haberhauer, Taunusstein, all of Germany; Mathias Eichhorn, Seoul, Rep. of Korea; Fritz-Feo Grabley, Koenigstein; Thomas Leichsenring, Mainz, both of Germany; Gabor I. Koletar, Berkeley Heights; Douglas A. Seeley, High Bridge, both of N.J.

[73] Assignee: Agfa-Gevaert N.V., Mortsel, Belgium

[21] Appl. No.: 09/038,162

[22] Filed: Mar. 11, 1998

[30] Foreign Application Priority Data

Mar. 24, 1997 [DE] Germany ........................... 197 12 323

[51] Int. Cl.$^{7}$ ............................. G03F 7/021; G03F 07/30

[52] U.S. Cl. .......................... 430/176; 430/191; 430/192; 430/193; 430/270.1; 430/281.1; 430/302

[58] Field of Search ................................ 430/176, 281.1, 430/192, 191, 193, 270.1, 302

[56] References Cited

U.S. PATENT DOCUMENTS

| | | | |
|---|---|---|---|
| 5,658,708 | 8/1997 | Kondo | 430/288.1 |
| 5,731,123 | 3/1998 | Kawamura et al. | 430/176 |

FOREIGN PATENT DOCUMENTS

| | | |
|---|---|---|
| 0 562 952 | 9/1993 | European Pat. Off. . |
| 94/01280 | 1/1994 | WIPO . |
| 96/20429 | 12/1994 | WIPO . |
| 96/20429 | 7/1996 | WIPO . |
| 97/00175 | 1/1997 | WIPO . |

*Primary Examiner*—John S. Chu
*Attorney, Agent, or Firm*—Foley & Lardner

[57] ABSTRACT

A positive-working or negative-working radiation-sensitive mixture includes as an IR absorbing component a carbon black pigment having a primary particle size smaller than 80 nm. The carbon black pigment is predispersed in a polymer containing acidic units having a $pK_a$ of less than 13. The radiation-sensitive component may include an ester of (i) a 1,2-naphthoquinone-2-diazide-4-sulfonic acid or a 1,2-naphthoquinone-2-diazide-5-sulfonic acid and (ii) a compound having at least one phenolic hydroxyl group, such as 3 to 6 phenolic hydroxyl groups. After imagewise radiation exposure, the recording material including the radiation-sensitive mixture can be developed without difficulties in an aqueous alkaline solution without leaving residual coating on the areas that became soluble or that remained soluble upon exposure.

17 Claims, No Drawings

RADIATION-SENSITIVE MIXTURE AND RECORDING MATERIAL MADE THEREOF FOR OFFSET PRINTING PLATES

BACKGROUND OF THE INVENTION

1. Field of the Invention

The present invention relates to a positive-working or negative-working radiation-sensitive mixture and to a recording material having a substrate and a coating including the mixture. In particular, the recording material is suited for making offset printing plates.

2. Description of Related Art

Radiation-sensitive or light-sensitive mixtures based on naphthoquinone-2-diazide compounds as well as their use in recording materials such as photoresists or presensitized offset printing plates have been frequently described in the literature. The imagewise exposure of such materials proceeds with radiation sources emitting radiation in the absorption range of the quinone diazides, i.e., in the range of about 350 to 450 nm. The imagewise exposure is usually followed by a processing or developing step. Aqueous alkaline solutions based on alkali silicates are widely used as developers in making printing plates. The processed printing plates may be treated with an appropriate correction solution, and if they are not intended for immediate use on the printing press, preservation with a hydrophilic agent is advantageous.

As a result of the further development of the art, high-power, low-cost infrared light sources basically suited for direct imaging of recording materials have been provided. In particular, laser diodes emitting radiation at a wavelength of about 800 nm, and Nd:YAG lasers emitting radiation at a wavelength of about 1064 nm are mentioned. Furthermore, the use of carbon as an IR absorbing component has been disclosed (e.g., in WO 96/20,429). Carbon absorbs IR radiation throughout a wide wavelength range. So far, the use of carbon or carbon pigments in the radiation-sensitive coating of the recording materials as described above have failed because the recording materials after the imagewise IR exposure could not be processed regularly with an aqueous alkaline developer. The processing was often found to be incomplete, i.e., the residual radiation-sensitive coating was left on the radiation-exposed or radiation-unexposed areas.

SUMMARY OF THE INVENTION

It is therefore an object of the present invention to provide recording materials of the type described above—so-called dual-mode recordable materials—that are suited both for conventional imaging, i.e., using visible light and UV radiation, and for infrared radiation imaging. Imaging should be feasible using various IR radiation sources. In addition, processing of the imagewise radiation-exposed materials in the common aqueous alkaline solutions should be possible without any difficulties.

It is also an object of the present invention to provide a radiation-sensitive mixture useful in such recording materials, and methods of making and using such mixtures and materials.

In accordance with these objects, there is provided, in accordance with the present invention, a positive-working or negative-working radiation-sensitive mixture comprising as an IR absorbing component a carbon black pigment having a primary particle size smaller than 80 nm, wherein the carbon black pigment is predispersed in a polymer containing one or more acidic units having a $pK_a$ of less than 13.

In accordance with these objects, there is also provided a recording material including an aluminum substrate and a radiation-sensitive coating that includes a mixture as described above.

In accordance with these objects, there further is provided a process for making a printing plate precursor, comprising imagewise exposing to infrared radiation and subsequently developing in an aqueous alkaline solution at a temperature of 20 to 40° C., a radiation-sensitive recording material as described above.

In accordance with these objectives, there is also provided a dispersion comprising a carbon black pigment having a primary particle size smaller than about 80 nm, dispersed in a polymer containing one or more acidic units having a $pK_a$ of less than 13.

Further objects, features, and advantages of the present invention will become apparent from the detailed description of preferred embodiments that follows.

DETAILED DESCRIPTION OF PREFERRED EMBODIMENTS

The present invention is directed to a positive-working or negative-working radiation-sensitive mixture which comprises as an IR absorbing component a carbon black pigment having a primary particle size smaller than 80 nm, said carbon black pigment being predispersed in a polymer containing acidic units having a $pK_a$ of less than 13. The primary particle size of the carbon black pigment is in general in a range of from about 1 to less than 80 nm, preferably in a range of from 10 to 60 nm, in particular in a range of from 10 to 30 nm. The $pK_a$ in general in a range of from about 1 to less than 13, preferably of from about 4 to less than 13.

Any polymer having one or more acidic groups and the mentioned $pK_a$ are useful. Preferred acidic units having a $pK_a$ of less than 13 are units wherein an acidic proton is attached to a heteroatom, such as an oxygen atom, a nitrogen atom, a sulfur atom or a phosphorus atom. Particularly useful acidic groups include groups corresponding to the formulae $—NH_2$ and —NH—, and phenolic hydroxyl groups and carboxyl groups. Particularly suited $—NH_2$ and —NH— groups are those that are directly attached to a $—SO_2—$ or a —CO— group. Special mention is made of sulfonamido groups. Preferably, the acidic groups are present in the polymer in a concentration of at least 1 mmol/g, more preferably of at least 1.5 mmol/g. In general, the acidic groups are present in the polymer in a concentration of from 1.0 to 22 mmol/g, preferably of from 1.5 to 19 mmol/g. According to a preferred embodiment the ratio by weight of polymer having acidic units to carbon black pigment is at least 1 in the dispersed product. The ratio by weight is preferably in the range of from 1 to 20, in particular of from 1 to 10.

Any carbon block having a primary particle size of less than 80 nm is useful in the invention. Particularly satisfactory results are obtained with a carbon black pigment having a so-called B.E.T. surface area of at least 30 $m^2/g$. Preferably, the carbon black pigment has a B.E.T. surface in the range of from 30 to 1,000$m^2$ per gram, in particular in the range of from 30 to 500 $m^2$ per gram. The expression B.E.T. surface area means in the present context that the surface area was determined in accordance with the process introduced by Brunauer, Emmett, and Teller. The average primary particle size is preferably smaller than 60 nm. Primary particle size indicates the size of the pigments such as obtained upon manufacture (i.e., before dispersing). It is determined from electron micrographs, e.g. by using the semiautomatic particle size analyser TGZ 3 from Carl Zeiss, Oberkochen, Germany.

The mixture of the invention may include any desired radiation-sensitive component or components. The radiation-sensitive component in the mixture may be a diazonium salt; a combination of a photopolymerization initiator and a polymerizable monomer (particularly a monomer having a polymerizable ethylenically unsaturated group); and/or a combination of a compound forming acid upon irradiation and a compound cleavable by the photochemically produced acid.

Preferably, the radiation-sensitive component is an ester of a 1,2-naphthoquinone-2-diazide-4-sulfonic acid or a 1,2-naphthoquinone-2-diazide-5-sulfonic acid and a compound having at least one phenolic hydroxyl group. The latter compound preferably has at least 3 phenolic hydroxyl groups. Particularly preferred compounds for the esterification have 3 to 6 phenolic hydroxyl groups. Typical examples thereof include 2,3,4-trihydroxy-benzophenone, 2,3,4-trihydroxy-3'-methyl-benzophenone, 2,3,4-trihydroxy-3'-propyl-benzophenone or 2,3,4-trihydroxy-3'-isopropyl-benzophenone, 2,3,4,4'-tetrahydroxy-benzophenone, 2,3,4,2',4'-pentahydroxy-benzophenone, 2,3,4,2',3',4'-hexahydroxy-benzophenone and 5,5'-diacyl-2,3,4,2',3',4'-hexahydroxy-diphenylmethane.

Amides of 1,2-naphthoquinone-2-diazide-4-sulfonic acid or of 1,2-naphthoquinone-2-diazide-5-sulfonic acid are also useful. Further useful esterification components are condensates of pyrogallol with aldehydes or ketones as well as condensates of alkylated phenols with formaldehyde. The amount of radiation-sensitive compounds is selected as to provide effective results and generally ranges from about 1 to 50% by weight, preferably 10 to 40% by weight, relative to the total weight of the non-volatile constituents of the mixture.

Examples of polymers with acidic groups having a $pK_a$ of less than 13 useful in the present invention include polycondensates of (i) phenols (such as phenol, resorcinol, a cresol, a xylenol, a trimethylphenol) or sulfamoyl-substituted or carbamoyl-substituted aromates with (ii) aldehydes (such as formaldehyde) or ketones, furthermore with bis(methylol)-substituted ureas. The reaction products of diisocyanates with diols or diamines having acidic units of the described type are also useful.

Further examples include polymers having units of vinyl aromatic compounds, from N-aryl (meth)acrylamide or from aryl (meth)acrylate, wherein these units further comprise one or more carboxyl groups, phenolic hydroxyl groups, sulfamoyl groups, or carbamoyl groups. Typical examples include polymers having units of 2-hydroxyphenyl acrylate or 2-hydroxyphenyl methacrylate, N-(4-hydroxyphenyl) acrylamide or N-(4-hydroxyphenyl) methacrylamide, N-(4-sulfamoylphenyl) acrylamide or N-(4-sulfamoylphenyl) methacrylamide, N-(4-hydroxy-3,5-dimethylbenzyl) acrylamide or N-(4-hydroxy-3,5-dimethylbenzyl) methacrylamide, and/or 4-hydroxystyrene or hydroxyphenylmaleimide. In addition, the polymers may contain units of other monomers containing no acidic units such as, for example, olefinic units or vinyl aromatic units, methyl(meth) acrylate units, phenyl(meth)acrylate units, benzyl (meth) acrylate units, methacrylamide units or acrylonitrile units. The expression (meth)acrylate in the present context means acrylate and/or methacrylate.

In addition, the radiation-sensitive mixture may contain a polymeric binder. Any desired binder can be used. A preferred polymeric binder is the same binder as is used in the predispersing step of the carbon black. The amount of the binder is an effective amount to yield desired results and generally ranges from 2 to 90% by weight, preferably from 30 to 90% by weight, in particular from 50 to 85% by weight, relative to the total weight of the non-volatile constituents of the radiation-sensitive mixture. This amount of binder includes the binder used in the predispersing step as well as the subsequently added binder.

Preferred carbon blacks present in the radiation-sensitive mixture are flame, furnace, or channel blacks having an average primary particle size of 80 nm or less. Preferably, the primary particle size is smaller than 60 nm, more preferably smaller than 30 nm. The B.E.T. surface area of the carbon blacks preferably amounts to at least 30 $m^2/g$. According to a preferred embodiment the carbon blacks are oxidized or reoxidized resulting in the formation of acidic units at the surface of the carbon black, so that the pH of an aqueous dispersion of these carbon blacks is below 7, in particular the pH of the aqueous dispersion is in a range of from about 2 to less than 7. The pH value is determined by suspending 1 g of carbon black pigment in 20 ml of distilled water and stirring the suspension for 1 min, followed by immersing the glas electrode of a pH meter in the suspension. The pH value after 1 min. of measuring was then taken.

Surprisingly, the carbon blacks predispersed in the described way can be readily dispersed in the radiation-sensitive mixture. In addition, the dispersion exhibits an enhanced stability. In general, the carbon black is present in an effective amount generally an amount of 0.5 to 30% by weight, preferably 2 to 15% by weight, relative to the total weight of the non-volatile constituents of the mixture.

The carbon black dispersions can be prepared from the carbon blacks and the binders having acidic groups using well-known devices. After predispersing in a dissolver, the mixture can be fine-dispersed, e.g., in a ball mill. The solvents used to that effect may be the same as those applied for coating purposes (such as propylene glycol monomethyl ether, butanone, or γ-butyrolactone). The total solids content of the dispersions is generally in the range of 5 to 50% by weight, the carbon black proportion being preferably smaller than the binder amount. In many cases admixture of surfactants or thickeners is of advantage for improving the dispersion stability. Preferably, surfactants or thickeners that are soluble in the aqueous alkaline developers are used.

In addition to the above-mentioned components, the radiation-sensitive mixture may contain other additives commonly used in recording materials for making printing plates. These additives include, for example, indicator dyes (e.g., dialkylaminobenzenes), photochemical acid formers (e.g., trifluoromethane sulfonates or hexafluoro-phosphates of diazodiphenylamines), surfactants (preferably fluorine-containing surfactants or silicone-based surfactants), poly (alkylene oxides) for controlling the acidity of the acidic units, and low-molecular weight compounds having acidic units for increasing the processing speed.

It is a further object of the invention to provide a recording material having a substrate and a radiation-sensitive coating, the coating comprising the mixture according to the invention. However, the radiation-sensitive mixture may be used for other purposes, e.g., as a photoresist.

Any desired substrate can be used for the recording material according to the invention. For example, an aluminum foil or a composite foil of polyester-laminated aluminum can be used. Preferably, the aluminum surface has been grained and anodized, and hydrophilized by means of a compound comprising at least one phosphonic acid unit or phosphonate unit. Before the graining step, a degreasing and pickling using alkaline solutions may be applied, and a mechanical and/or chemical pregraining may be carried out. Next, the substrates are coated with a solution of the above-described radiation-sensitive mixture in desired organic solvent or solvent mixture and subsequently dried.

Also, the invention relates to a process for making a planographic printing plate wherein the recording material according to the invention is imagewise exposed to infrared radiation and subsequently processed in an aqueous alkaline developer at a temperature of 20 to 40° C.

Preferably, the developer has a silicon dioxide to alkali oxide ratio of 1 or of greater than 1, thereby preventing the aluminum oxide layer from being damaged during the processing operation. Preferred alkali oxides include $Na_2O$ and $K_2O$ and mixtures thereof. In addition to alkali silicate, the developer may contain other constituents (such as buffering agents, complexing agents, antifoaming agents, solvents, corrosion inhibitors, dyes, surfactants, and/or hydrotropes). The temperature in the developing step is not critical and can be chosen in a wide range of from about 10 to 60° C., preferably of from 20 to 40° C. Preferably, the processing operation proceeds in machine-processing equipments. Replenishment is carried out by means of alkali silicate solutions having alkali contents in the range of from 0.6 to 2.0 mol/l. The silicon dioxide to alkali oxide ratio of these solutions may be equal to (however, it is generally smaller than) that of the developer, and these solutions also may contain other additives. The required replenishment rates should be adjusted to the processors used, the daily plate throughputs, the image content, etc., and are usually in the range of 1 to 50 ml per sq m of recording material. The metering may be controlled, e.g., by measuring the electric conductance as described by EP-A 556,690, hereby incorporated by reference in its entirety.

In order to increase the printing durability of the processed plates as well as their resistance to washout solutions, correction solutions and UV-hardenable printing inks, they may be briefly heated to increased temperatures, as disclosed in GB 1,154,749 (hereby incorporated by references) dealing with diazo coatings.

The present invention is illustrated more in detail by the following examples and comparison examples (comparison substances being marked by an asterisk). All parts and percentages are by weight, except where otherwise specified. The examples are for illustrative purposes only and do not limit the scope of the invention.

EXAMPLE 1

A reoxidized carbon black having an average primary particle size of 20 nm (the aqueous dispersion thereof having a pH of 3) and a B.E.T. surface area of 300 $m^2/g$ was processed in admixture with the following resins to produce a dispersion:

1.1 m or p-cresol-formaldehyde novolak (phenolic hydroxyl groups content: 8.3 mmol/g)
1.2 poly[(methacrylic acid)-co-(2-hydroxyethyl methacrylate)] (carboxyl groups content: 1.6 mmol/g)
1.3 4-hydroxy-3,5-dimethylbenzyl methacrylamide homopolymer (phenolic hydroxyl groups content: 4.5 mmol/g)
1.4 poly[(2-hydroxyphenyl methacrylate)-co-(methyl methacrylate)] (phenolic hydroxyl groups content: 4.7 mmol/g)
1.5 4-sulfamoylphenyl methacrylamide homopolymer (sulfamoyl groups content: 4.1 mmol/g)
1.6 4-hydroxyphenyl acrylamide homopolymer (phenolic hydroxyl groups content: 6.1 mmol/g)
1.7 (pyrogallol-co-aceton) condensate (phenolic hydroxyl groups content: 18.1 mmol/g)
1.8 poly(4-hydroxystyrene) (phenolic hydroxyl groups content: 8.3 mmol/g)
1.9* poly(vinyl butyral) (contains no acidic groups having a $pK_a$ of less than 13)

The total solids content of the dispersion amounted to 30%. The carbon black-to-resin ratio was 1:2. Propylene glycol monomethyl ether (PGME) was applied as solvent. Predispersing was carried out in a dissolver and fine-dispersing in a ball mill.

Coating solutions were prepared from

| | |
|---|---|
| 20% by wt | of an esterification product of 1 mole 2,3,4-trihydroxy-benzophenone and 1.5 mole 1,2-naphthoquinone-2-diazide-5-sulfonyl chloride |
| 20% by wt | (calculated on the solids) of each of the carbon black dispersions (1.1 to 1.9*) |
| 3% by wt | 2,4-dihydroxy-benzophenone |
| q.s. ad 100% by wt | of the novolak of dispersion 1.1 |

in propylene glycol monomethyl ether and tetrahydrofuran (1:1) having a total solids content of 11% by weight.

The above-mentioned solutions were applied to an aluminum foil grained in hydrochloric acid, anodized in sulfuric acid, and hydrophilized with poly(vinyl phosphonic acid). After drying for 2 min at 100° C., a coating thickness of 2 $\mu$m was obtained.

The thus obtained recording materials were exposed to infrared radiation in an internal-drum recorder by using a Nd:YAG laser with a power of 8.0 W, a recording speed of 367 m/s, and a laser spot size of 10 $\mu$m.

Processing was carried out in a conventional processor at a throughput speed of 0.4 m/min and a temperature of 28° C. by means of a potassium silicate developer containing $K_2SiO_3$ (normality 0.8 mole/l in water), 0.2% by weight of polyglycol-1000-dicarboxylic acid, and 0.4% by weight of pelargonic acid.

The recording materials prepared from the predispersed carbon blacks 1.1 to 1.8 could be processed without residual coating. The recording material prepared from carbon black 1.9* exhibited fogging due to residual coating resulting in scumming on the printing press.

EXAMPLE 2

Example 1 was repeated with the difference, however, that the infrared exposure was carried out with an external-drum recorder equipped with a linear laser diode array having an emission peak at 830 nm (power of each of the diodes: 40 mW, recording speed: 1 m/s, laser spot size: 10 $\mu$m). Processing proceeded analogously to example 1, the result for fogging due to residual coating was the same.

EXAMPLE 3

Carbon black dispersions were prepared as described in example 1 using the following types of carbon black.

| N° | Type | Particle size (nm) | pH | B.E.T. ($m^2/g$) |
|---|---|---|---|---|
| 3.1 | HCC | 13 | 2.5 | 460 |
| 3.2 | HCC | 17 | 2.5 | 300 |
| 3.3 | MCC | 20 | 2.7 | 240 |
| 3.4 | RCC | 25 | 4 | 10 |
| 3.5 | LCF | 56 | 3 | 45 |
| 3.6* | flame carbon black | 95 | 7 | 20 |

dispersing resin: m-cresol novolak of example 1.1
total solids content of the dispersions: 30%
carbon black-to-resin ratio: 1:3
solvent: propylene glycol monomethyl ether/butyrolactone (95:5)
predispersing: dissolver
fine-dispersing: ball mill
HCC: High Color Channel black
MCC: Medium Color Channel black
RCC: Regular Color Channel black
LCF: Low Color Furnace black.

A 5-day, shelf-life test was conducted to determine the stability of the dispersions. The following results were recorded:

3.1 to 3.4: good stability
3.5: stability still acceptable
3.6*: perceptible sedimentation Coating solutions were prepared from

| | |
|---|---|
| 13% by wt | of an ester of 1 mole 2,3,4-trihydroxy-benzophenone and 1.5 mole 1,2-naphthoquinone-2-di azide-5-sulfonyl chloride |
| 2% by wt | of an ester of 1 mole p-cumenylphenol and 1 mole 1,2-naphthoquinone-2-diazide-4-sulfonyl chloride |
| 30% by wt | (calculated on the solids) of each of the carbon black dispersions (3.1 to 3.6*) |
| 0.5% by wt | of dimethylaminoazobenzene |
| 15% by wt | of poly(4-hydroxystyrene) |
| q.s. ad 100% by wt | of the novolak of dispersion 1.1 |

in propylene glycol monomethyl ether and methyl ethyl ketone (2:1) having a total solids content of 11% by weight.

The above-mentioned solutions were applied to an aluminum foil grained in nitric acid, anodized in sulfuric acid, and hydrophilized with poly(vinyl phosphonic acid). After drying for 2 min at 100° C., a coating thickness of 1.5 $\mu$m was obtained.

A perfect coating was obtained with the predispersed carbon black types 3.1 to 3.5, the predispersed carbon black type 3.6*, however, resulted in coating defects.

The printing plates were exposed in an internal-drum recorder to the infrared radiation of a Nd:YAG laser having a power of 6.5 W, a recording speed of 367 m/s, and a laser spot size of 10 $\mu$m.

Processing was carried out in a conventional processor at 0.8 m/min at developer temperature of 25° C. by means of following developer: $Na_2SiO_3$ (normality 0.8 mole/l), polyglycol-2000-dicarboxylic acid 0.1% by weight, caprylic acid 0.4% by weight. In all cases processing was possible without residual coating.

EXAMPLE 4

Example 3 was repeated with the difference, however, that the infrared exposure was carried out in an external-drum recorder equipped with a linear laser diode array having an emission peak at 830 nm (power of each of the diodes, 40 mW; recording speed, 1.1 m/s; laser spot size, 10 $\mu$m). Processing proceeded analogously to example 3, the result for fogging due to residual coating was the same.

EXAMPLE 5

Example 3 was repeated with the difference, however, that the exposure proceeded to UV light in a conventional copying frame: 5 kW metal halide-doped mercury vapor lamp emitting in the range of 350 to 450 nm, luminous energy dose, 700 mJ/$cm^2$. Processing proceeded analogously to example 3, the result for fogging due to residual coating was the same.

German Application 197 12 323.6 (the priority document of the present application) filed Mar. 24, 1997 is hereby incorporated by reference in its entirety.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A positive-working or negative-working radiation-sensitive mixture comprising.

a radiation-sensitive component or components; and an infrared absorbing component including a carbon black pigment having a primary particle size smaller than 80 nm, wherein the carbon black pigment is predispersed in a polymer containing one or more acidic units having a $pK_a$ of less than 13;

the carbon black pigment has a B.E.T. surface area of at least 30 $m^2$/g; and the carbon black is acidic such that a dispersion of the carbon black pigment in water has a pH of less than 7.

2. A mixture according to claim 1, where the acidic units include an acid proton attached to a hetero-atom.

3. A mixture according to claim 1, where the acidic unit comprises a unit of the formula —$NH_2$ or —NH—.

4. A mixture according to claim 1, wherein the polymer contains at least 1 mmol of acid groups per gram of polymer.

5. A mixture according to claim 1, wherein the polymer contains at least 1.5 mmol of acid groups per gram of polymer.

6. A mixture according to claim 1, wherein the carbon black pigment has an average primary particle size smaller than 60 nm.

7. A mixture according to claim 1, wherein the carbon black pigment has an average primary particle size smaller than 30 nm.

8. A mixture according to claim 1, comprising a radiation-sensitive component which includes one or more of (i) a diazonium salt; (ii) a combination of a photo-polymerizing initiator and a polymerizable monomer; (iii) a combination of a compound forming acid upon irradiation and a compound cleavable by the photochemically produced acid; or (iv) an ester of (a) a 1,2-naphthoquinone-2-diazide-4-sulfonic acid or 1,2-naphthoquinone-2-diazide-5-sulfonic acid, and (b) a compound having at least one phenolic hydroxyl group.

9. A mixture according to claim 8, wherein the radiation-sensitive component includes (iv) and a compound containing phenolic hydroxyl groups has at least 3 phenolic hydroxyl groups.

10. A mixture according to claim 9, wherein the compound containing phenolic hydroxyl groups has 3 to 6 phenolic hydroxyl groups.

11. A recording material comprising an aluminum substrate and a radiation-sensitive coating that comprises a mixture as claimed in claim 1.

12. A recording material according to claim 11, wherein the substrate comprises an aluminum foil.

13. A process for making a printing plate, comprising imagewise exposing to infrared radiation and subsequently developing in an aqueous alkaline solution at a temperature of 20 to 40° C., a radiation-sensitive recording material as claimed in claim 11.

14. A mixture according to claim 1, wherein the acid unit comprises a phenolic hydroxyl group or a carboxyl group.

15. A mixture according to claim 1, wherein the acid unit comprises a sulfonamide group.

16. A mixture according to claim 1, wherein the carbon black includes acidic units on the surface of the carbon black.

17. A method of making a radiation-sensitive mixture as claimed in claim 1, comprising predispersing, the carbon black in the polymer to form a dispersion, and combining the dispersion with a radiation-sensitive component.

* * * * *